(12) United States Patent
Fujimoto et al.

(10) Patent No.: US 6,784,681 B2
(45) Date of Patent: Aug. 31, 2004

(54) SEMICONDUCTOR INTEGRATED CIRCUIT TESTING SYSTEM AND METHOD

(75) Inventors: Keiichi Fujimoto, Soraku-gun (JP); Yoshiro Nakata, Soraku-gun (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/964,480

(22) Filed: Sep. 28, 2001

(65) Prior Publication Data

US 2002/0105354 A1 Aug. 8, 2002

(30) Foreign Application Priority Data

Feb. 5, 2001 (JP) ........................................ 2001-028597

(51) Int. Cl.[7] .............................................. G01R 31/26
(52) U.S. Cl. ...................... 324/765; 324/754; 324/158.1
(58) Field of Search ................................ 324/754, 765, 324/758, 756, 158.1

(56) References Cited

U.S. PATENT DOCUMENTS 6,297,658 B1 * 10/2001 Nakata et al. .............. 324/765

FOREIGN PATENT DOCUMENTS

| JP | 7-283280 A | 10/1995 |
| JP | 8-80076 | 3/1997 |
| JP | 11-135582 | 5/1999 |

* cited by examiner

Primary Examiner—Evan Pert
Assistant Examiner—Paresh Patel
(74) Attorney, Agent, or Firm—McDermott, Will & Emery

(57) ABSTRACT

A semiconductor integrated circuit testing system for testing electric characteristics of a plurality of semiconductor integrated circuit devices formed on a semiconductor wafer in the lump includes a wafer tray for holding the semiconductor wafer and an interconnect substrate facing the semiconductor wafer held on the wafer tray and having interconnect layers to which a testing voltage is externally input. A ring-shaped sealing member is provided between the wafer tray and the interconnect substrate so as to form a sealed space together with the wafer tray and the interconnect substrate. An elastic sheet is held on the interconnect substrate at the periphery thereof. A plurality of probe terminals electrically connected to the interconnect layers are provided on the elastic sheet in positions respectively corresponding to external electrodes of the plural semiconductor integrated circuit devices. A plurality of protrusions protruding toward the wafer tray are provided on the elastic sheet for preventing the interconnect substrate from deforming toward the wafer tray when the internal pressure of the sealed space is reduced.

14 Claims, 9 Drawing Sheets

SEMICONDUCTOR INTEGRATED CIRCUIT TESTING SYSTEM AND METHOD

BACKGROUND OF THE INVENTION

The present invention relates to a semiconductor integrated circuit testing method in which electric characteristics of a plurality of semiconductor integrated circuit devices formed on a semiconductor wafer are tested in the lump at wafer level, and a testing system used in the testing method.

Conventionally, a semiconductor chip is electrically connected to a lead frame through bonding wires and the semiconductor chip and inner leads of the lead frame are sealed in a resin or ceramic, so as to be mounted on a printed substrate as a semiconductor device.

However, owing to demands for compactness and price reduction of electric equipment, a method for mounting, on a circuit substrate, a semiconductor chip (semiconductor integrated circuit device) in a bare-chip state cut out from a semiconductor wafer has been developed, and it is desired to supply a bare-chip with assured quality at a low price. In order to assure the quality of a bare-chip, it is preferred from the viewpoint of cost reduction to carry out a burn-in test on a plurality of semiconductor integrated circuit devices formed on a semiconductor wafer in the lump.

Therefore, a semiconductor integrated circuit testing system for testing electric characteristics of a plurality of semiconductor integrated circuit devices formed on a semiconductor wafer in the lump at wafer level by using a testing substrate having probe terminals disposed in positions respectively corresponding to external electrodes of the plural semiconductor integrated circuit devices has been proposed.

FIG. 7 shows the cross-sectional structure of the conventional semiconductor integrated circuit testing system. A large number of external electrodes 2 are provided on a plurality of semiconductor integrated circuit devices formed on a semiconductor wafer 1, and the periphery of each external electrode 2 is covered with a passivation film 3.

A testing substrate 4 is provided so as to face the semiconductor wafer 1. The testing substrate 4 includes an interconnect substrate 5 having interconnect layers 5a; an elastic sheet 7 of, for example, a polyimide resin fixed on the interconnect substrate 5 at its periphery with a rigid ring 6; semispherical bumps 8 provided on the elastic sheet 7 in positions corresponding to the external electrodes 2 of the semiconductor wafer 1; isolated patterns 9 of, for example, a copper film, integrated with the bumps 8 and provided on the face of the elastic sheet 7 other than the face where the bumps 8 are provided; and an anisotropic conducting rubber sheet 10 provided between the interconnect substrate 5 and the elastic sheet 7 for electrically connecting one end of each interconnect layer 5a of the interconnect substrate 5 to the corresponding isolated pattern 9. The anisotropic conducting rubber sheet 10 has conducting particles 10a linearly arranged therein, so that one end of the interconnect layer 5a can be electrically connected to the isolated pattern 9 through the conducting particles 10a. Also, the other end of the interconnect layer 5a of the interconnect substrate 5 is connected to a burn-in system not shown for supplying a power voltage, a ground voltage or a testing voltage such as a signal voltage.

A wafer tray 11 has a wafer holder 11a for holding the semiconductor wafer 1, and the wafer holder 11a is provided at its periphery with a ring-shaped sealing member 12 of en elastic substance having a lip-shaped cross-section. A ring-shaped pressure reducing groove 13 is formed on the wafer tray 11 between the wafer holder 11a and the sealing member 12, and opposing portions of the pressure reducing groove 13 are mutually communicated through a communicating path 14 formed below the wafer holder 11a. A passage closing valve 15 is provided on one side of the wafer tray 11, and the passage closing valve 15 is connected to a vacuum pump 17 through a pressure reducing tube 16.

Now, the method for testing electric characteristics of the plural semiconductor integrated circuit devices formed on the semiconductor wafer 1 by using the semiconductor integrated circuit testing system having the aforementioned structure will be described.

First, the wafer tray 11 is brought close to the testing substrate 4 with the external electrodes 2 of the semiconductor wafer 1 facing the bumps 8 of the testing substrate 4, so that the wafer tray 11, the ring-shaped sealing member 12 and the testing substrate 4 can together form a sealed space 18.

Next, the internal pressure of the pressure reducing groove 13 is reduced by driving the vacuum pump 17. In this manner, the pressure within the sealed space 18 is reduced, and hence, the cross-sectional shape of the ring-shaped sealing member 12 is elastically deformed to an arch shape. As a result, the testing substrate 4 and the wafer tray 11 are brought further closer to each other, so that the bumps 8 can be definitely brought into contact with the corresponding external electrodes 2.

Under this condition, a testing voltage is applied from the burn-in system not shown to some of the external electrodes 2 through the interconnect layers 5a of the interconnect substrate 5, the conducting particles 10a of the anisotropic conducting rubber sheet 10, the isolated patterns 9 and the bumps 8, and output signals output from other of the external electrodes 2 are input to the burn-in system. Thus, the burn-in system can evaluate the electric characteristics of the semiconductor integrated circuit devices.

When the internal pressure of the sealed space 18 is reduced as described above, the testing substrate 4 and the wafer tray 11 are brought close to each other so as to definitely bring the bumps 8 into contact with the corresponding external electrodes 2. However, at the same time, the interconnect substrate 5 and the wafer tray 11 are also brought close to each other in a region between the ring-shaped sealing member 12 and the bumps 8 positioned in an outermost peripheral region (hereinafter referred to as outermost bumps).

In this case, since the region between the ring-shaped sealing member 12 and the outermost bumps 8 has a comparatively large area, a strong force to bring the interconnect substrate 5 close to the wafer tray 11 works in this region.

However, merely the elasticity of the ring-shaped sealing member 12 having the lip-shaped cross-section works against the force to bring the interconnect substrate 5 close to the wafer tray 11. Accordingly, in the interconnect substrate 5 having small rigidity as compared with the wafer tray 11, its periphery is deformed so as to come close to the wafer tray 11.

Although the rigidity of the interconnect substrate 5 can be increased by increasing the thickness of the interconnect substrate 5, the weight of the entire testing system is accordingly increased, which is inconvenient for the testing process. Therefore, it is not preferable to increase the thickness of the interconnect substrate 5.

Accordingly, the bumps 8 positioned in a peripheral region on the elastic sheet 7 (hereinafter referred to as peripheral bumps) are strongly pressed against the corresponding external electrodes 2 while the bumps 8 positioned in a center region on the elastic sheet 7 (hereinafter referred to as center bumps) are weakly pressed against the corresponding external electrodes 2. Specifically, the force to bring the bumps 8 into contact with the external electrodes 2 is largely varied in the plane of the semiconductor wafer 1. As a result, the tips of the peripheral bumps 8 are largely deformed, which degrades the durability of the bumps 8, and the contact resistance between the center bumps 8 and the corresponding external electrodes 2 is disadvantageously increased. Herein, the center region means a large region excluding the peripheral region.

FIG. 8 shows the relationship between the position of a bump 8 in the plane of the semiconductor wafer (indicated by the abscissa) and the area ratio (relative ratio) of an indentation formed at the tip of the bump 8 (indicated by the ordinate). The graph of FIG. 8 is obtained by plotting the area ratios of the indentations formed on the bumps 8 when the internal pressure of the sealed space 18 formed with the wafer tray 11, the ring-shaped sealing member 12 and the interconnect substrate 5 is reduced to a predetermined pressure and then restored to the atmospheric pressure. It is understood from FIG. 8 that the area ratio of the indentation on the outermost bump 8 is approximately twice as large as that of the indentation on the center bump 8.

FIG. 9A shows the indentation formed on the center bump 8 and FIGS. 9B and 9C show the indentations formed on the opposing outermost bumps 8. FIGS. 9A through 9C are on the same scale. It is understood also from FIGS. 9A through 9C that the area of the indentation on the outermost bump 8 is much larger than that of the indentation on the center bump 8.

SUMMARY OF THE INVENTION

In consideration of the aforementioned conventional problem, an object of the invention is improving the durability of bumps and equalizing contact resistances between the bumps and external electrodes by preventing the periphery of an interconnect substrate from deforming toward a wafer tray when the internal pressure of a sealed space formed with the wafer tray, the interconnect substrate and a ring-shaped sealing member is reduced.

In order to achieve the object, the semiconductor integrated circuit testing system of this invention for testing electric characteristics of a plurality of semiconductor integrated circuit devices formed on a semiconductor wafer in the lump, comprises a wafer tray for holding the semiconductor wafer; an interconnect substrate facing the semiconductor wafer held by the wafer tray and having interconnect layers to which a testing voltage is externally input; a ring-shaped sealing member provided between the wafer tray and the interconnect substrate for forming a sealed space together with the wafer tray and the interconnect substrate; an elastic sheet held on the interconnect substrate at a periphery thereof; a plurality of probe terminals provided on the elastic sheet in positions respectively corresponding to external electrodes of the plurality of semiconductor integrated circuit devices and electrically connected to the interconnect layers; and a plurality of protrusions protruding toward the wafer tray and provided on the elastic sheet for preventing the interconnect substrate from deforming toward the wafer tray when an internal pressure of the sealed space is reduced.

Furthermore, in order to achieve the object, the semiconductor integrated circuit testing method of this invention uses a testing system including a wafer tray for holding a semiconductor wafer on which a plurality of semiconductor integrated circuit devices respectively having external electrodes are formed; an interconnect substrate having interconnect layers to which a testing voltage is externally input; a ring-shaped sealing member provided between the wafer tray and the interconnect substrate for forming a sealed space together with the wafer tray and the interconnect substrate; an elastic sheet held on the interconnect substrate at a periphery thereof; a plurality of probe terminals provided on the elastic sheet in positions respectively corresponding to the external electrodes of the plurality of semiconductor integrated circuit devices and electrically connected to the interconnect layers; and a plurality of protrusions protruding toward the wafer tray and provided on the elastic sheet, and the method comprises the steps of holding the semiconductor wafer on the wafer tray with the external electrodes of the plurality of semiconductor integrated circuit devices respectively facing the plurality of probe terminals provided on the elastic sheet; forming the sealed space with the wafer tray, the ring-shaped sealing member and the interconnect substrate by making the wafer tray holding the semiconductor wafer and the interconnect substrate come close to each other; reducing an internal pressure of the sealed space for bringing the plurality of probe terminals into contact with the external electrodes respectively facing the plurality of probe terminals; and testing electric characteristics of the plurality of semiconductor integrated circuit devices in the lump by applying the testing voltage to the external electrodes in contact with the plurality of probe terminals through the interconnect layers and the plurality of probe terminals, and the step of reducing the internal pressure of the sealed space includes a sub-step of preventing the interconnect substrate from deforming toward the wafer tray by bringing the plurality of protrusions into contact with the semiconductor wafer held on the wafer tray.

In the semiconductor integrated circuit testing system or method of this invention, the plural protrusions work against a force to bring the interconnect substrate close to the wafer tray when the internal pressure of the sealed space is reduced. Therefore, the periphery of the interconnect substrate can be prevented from deforming toward the wafer tray. As a result, probe terminals positioned in an outermost peripheral region can be prevented from being strongly pressed against the corresponding external electrodes, and hence, the durability of the probe terminals can be prevented from degrading because of large deformation of tips of the probe terminals positioned in the outermost peripheral region. In addition, the force to bring the probe terminals into contact with the corresponding external electrodes can be equalized in the plane of the semiconductor wafer, and hence, the contact resistance between probe terminals positioned in a center region and the corresponding external electrodes can be reduced.

In the semiconductor integrated circuit testing system or method, the plurality of protrusions are preferably disposed in a region on the elastic sheet where the plurality of probe terminals are distributed relatively sparsely.

In this manner, in a region where the probe terminals are distributed relatively sparsely, a strong force to deform the interconnect substrate works as the internal pressure of the sealed space is reduced, but the plural protrusions resist the strong force to deform the interconnect substrate. Therefore, the tip portions of the probe terminals positioned in the peripheral region can be prevented from largely deforming, and the force to bring the probe terminals into connect with the external terminals can be equalized in the plane of the semiconductor wafer.

In the semiconductor integrated circuit testing system or method, the plurality of protrusions are preferably disposed in a region on the elastic sheet outside a region where the plurality of probe terminals are provided.

In general, it is necessary to provide a long distance between the ring-shaped sealing member and the external electrodes of the semiconductor integrated circuit devices and the corresponding probe terminals positioned in the outermost peripheral region on the semiconductor wafer. However, when the plural protrusions are disposed in the region on the elastic sheet outside the region where the plural probe terminals are provided, the plural protrusions resist the strong force to deform the interconnect substrate. Therefore, the tip portions of the probe terminals positioned in the peripheral region can be prevented from largely deforming, and the force to bring the probe terminals into connect with the external terminals can be equalized in the plane of the semiconductor wafer.

In the semiconductor integrated circuit testing system or method, the plurality of protrusions are preferably arranged circumferentially in a region on the elastic sheet corresponding to a periphery of the semiconductor wafer.

In this manner, a distance between a circumferential portion of the elastic sheet in contact with the ring-shaped sealing member and the circumferential positions where the plural protrusions are disposed can be constant. Therefore, the periphery of the interconnect substrate can be definitely prevented from deforming toward the wafer tray.

In the semiconductor integrated circuit testing system or method, the plurality of probe terminals are preferably composed of electrically connecting isolated patterns provided on a first face of the elastic sheet facing the interconnect substrate and electrically connected to the interconnect layers, and bumps respectively integrated with the electrically connecting isolated patterns and provided on a second face of the elastic sheet facing the wafer tray, and the plurality of protrusions are preferably composed of dummy isolated patterns provided on the first face of the elastic sheet, and dummy bumps respectively integrated with the dummy isolated patterns and provided on the second face of the elastic sheet.

In this manner, the dummy isolated patterns can be formed in the same structure as the electrically connecting isolated patterns and the dummy bumps can be formed in the same structure as the bumps, resulting in simplifying the design and fabrication process of the dummy bumps and the dummy isolated patterns.

In this case, a pressing force applied to all of the dummy isolated patterns when the internal pressure of the sealed space is reduced is preferably approximately ⅓ or more of a pressing force applied to all of the electrically connecting isolated patterns when the internal pressure of the sealed space is reduced.

In this manner, a difference between the pressing force applied to the bumps positioned in the center region and the pressing force applied to the bumps positioned in the outermost peripheral region can be largely reduced. As a result, the durability of the bumps positioned in the peripheral region can be improved, and the contact resistance between the bumps positioned in the center region and the corresponding external electrodes can be reduced.

BRIEF DESCRIPTION OF THE DRAWINGS

FIG. 3A shows the indentation formed on a center bump and FIGS. 3B and 3C show the indentations formed on opposing outermost bumps;

FIG. 9A shows the indentation formed on a center bump and FIGS. 9B and 9C show the indentations formed on opposing outermost bumps.

DETAILED DESCRIPTION OF THE INVENTION

A semiconductor integrated circuit testing system according to an embodiment of the invention will now be described with reference to the accompanying drawings.

Figure 1:
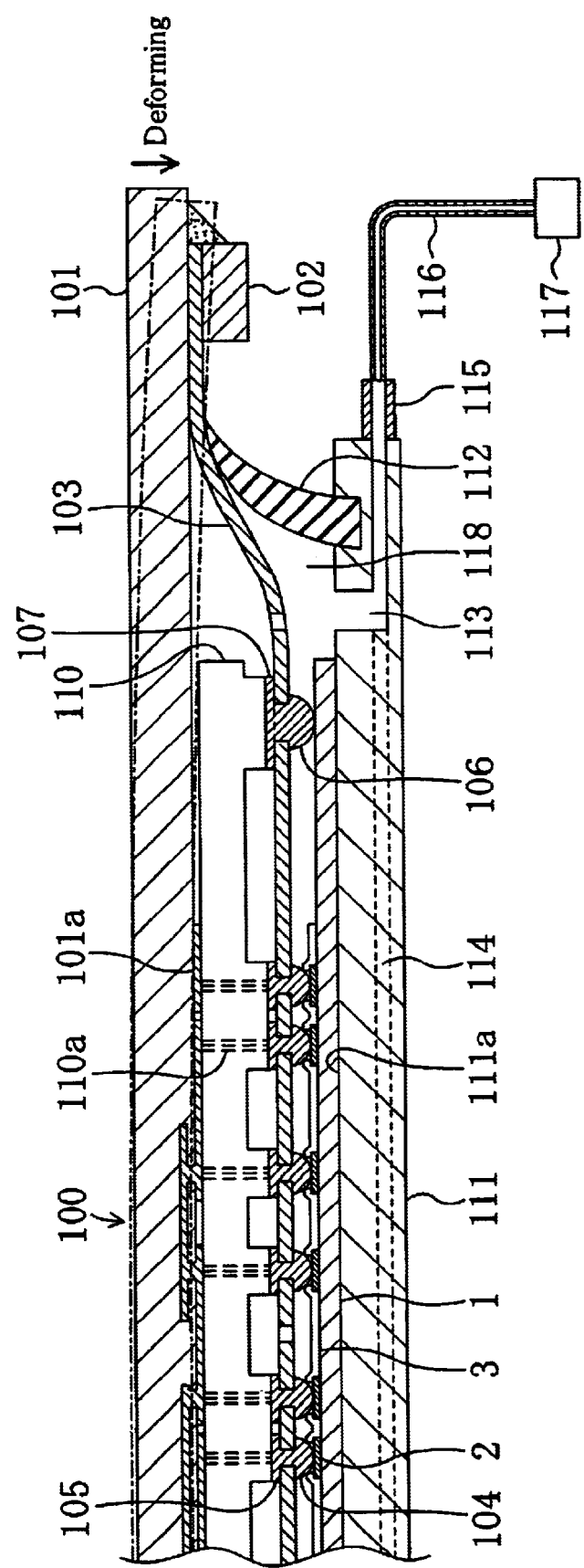
FIG. 1 is a partial cross-sectional view of a semiconductor integrated circuit testing system according to an embodiment of the invention.

FIG. 1 shows the cross-sectional structure of the semiconductor integrated circuit testing system of this embodiment. A large number of external electrodes 2 are provided on a plurality of semiconductor integrated circuit devices formed on a semiconductor wafer 1, and the periphery of each external electrode 2 is covered with a passivation film 3.

A testing substrate 100 is provided so as to face the semiconductor wafer 1. The testing substrate 100 has a similar structure to that of the conventional testing substrate, and specifically includes an interconnect substrate 101 having interconnect layers 101a; an elastic sheet 103 of, for example, a polyimide resin fixed on the interconnect substrate 101 at its periphery with a rigid ring 102; semispherical bumps (probe terminals) 104 provided on the elastic sheet 103 in positions corresponding to the external electrodes 2 of the semiconductor wafer 1; electrically connecting isolated patterns 105 of, for example, a copper film, integrated with the bumps 104 and provided on a face of the elastic sheet 103 other than the face where the bumps 104 are provided; and an anisotropic conducting rubber sheet 110 provided between the interconnect substrate 101 and the elastic sheet 103 for electrically connecting one end of each interconnect layer 101a of the interconnect substrate 101 to the corresponding electrically connecting isolated pattern 105. The anisotropic conducting rubber sheet 110 has conducting particles 110a linearly arranged therein, so that one end of the interconnect layer 101a can be electrically connected to the bump 104 through the conducting particles 110a. Also, the elastic sheet 103 is caught between the bumps 104 and the electrically connecting isolated patterns 105, so that the bumps 104 and the electrically connecting isolated patterns 105 can be held on the elastic sheet 103.

A wafer tray 111 has a wafer holder 111a for holding the semiconductor wafer 1, and the wafer holder 111a is provided at its periphery with a ring-shaped sealing member 112 of an elastic substance having a lip-shaped cross-section. A ring-shaped pressure reducing groove 113 is formed on the wafer tray 111 between the wafer holder 111a and the sealing member 112, and opposing portions of the pressure reducing groove 113 are mutually communicated through a communicating path 114 formed below the wafer holder 111a. A passage closing valve 115 is provided on one side of the wafer tray 111, and the passage closing valve 115 is connected to a vacuum pump 117 through a pressure reducing tube 116.

As a characteristic of this embodiment, a plurality of dummy bumps (protrusions) 106 protruding toward the wafer tray 111 are provided in a peripheral region on a face (lower face) of the elastic sheet 103 facing the wafer tray 111. The plural dummy bumps 106 prevent the interconnect substrate 101 from deforming toward the wafer tray 111 when the internal pressure of a sealed space 118 formed with the wafer tray 111, the ring-shaped sealing member 112 and the interconnect substrate 101 is reduced.

Dummy isolated patterns 107 integrated with the dummy bumps 106 are formed on the other face (upper face) of the elastic sheet 103 not facing the wafer tray 111. The elastic sheet 103 is caught between the dummy bumps 106 and the dummy isolated patterns 107.

The dummy isolated patterns 107 are formed in the same procedure as the electrically connecting isolated patterns 105, and the dummy bumps 106 are formed in the same procedure as the bumps 104.

Figure 4:
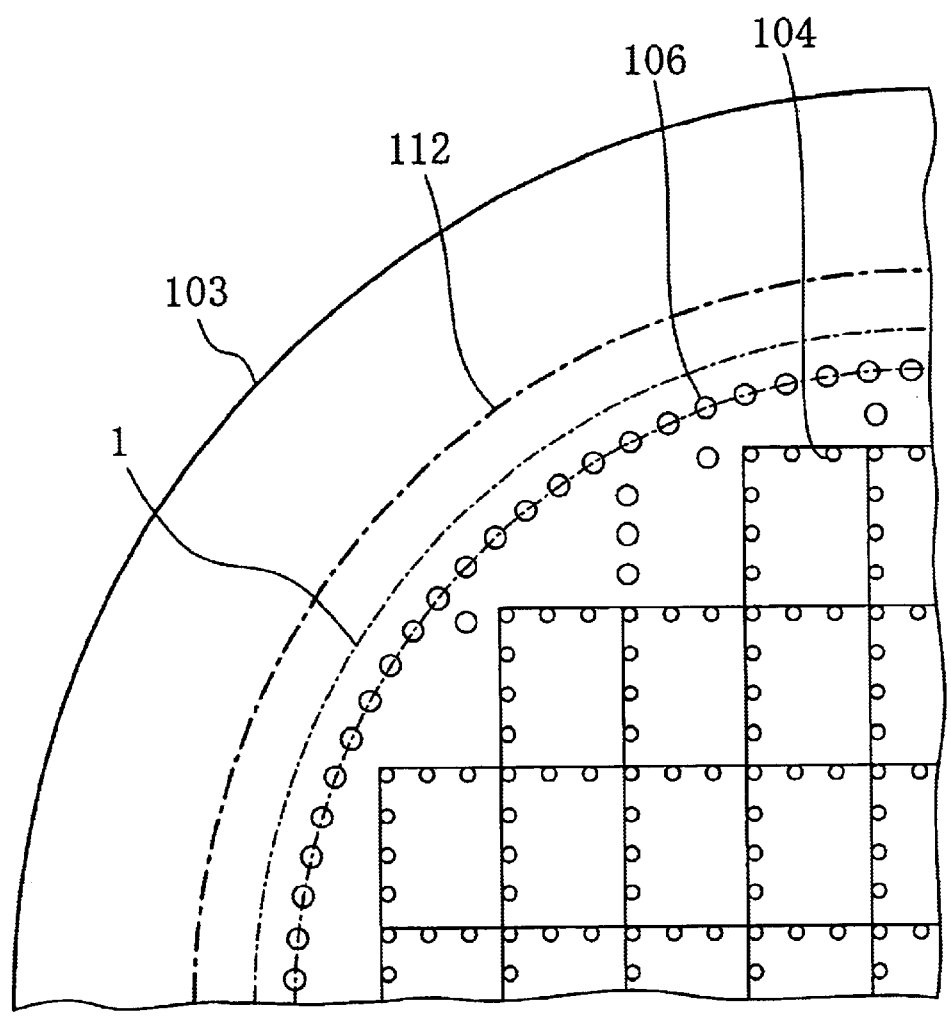
FIG. 4 is a partial plan view of a face of an elastic sheet facing a wafer tray in the semiconductor integrated circuit testing system of the embodiment.
Figure 5:
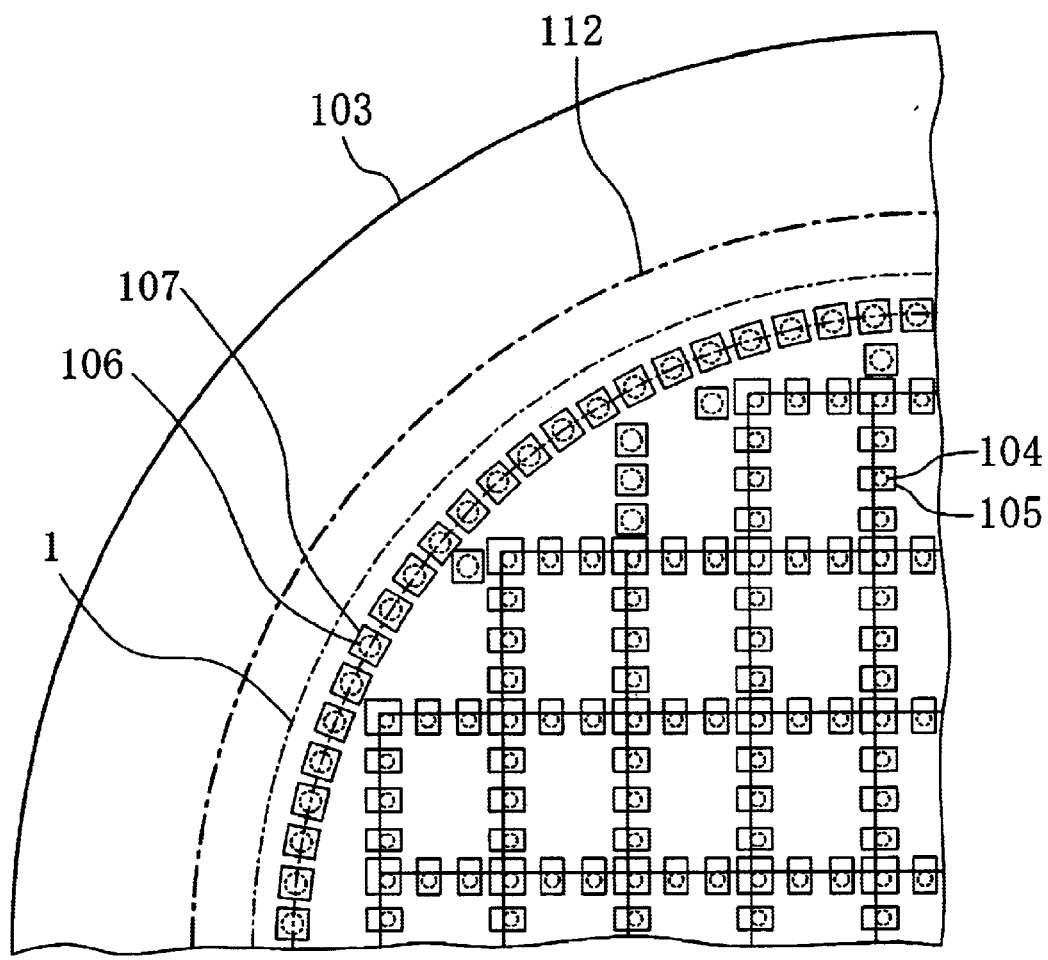
FIG. 5 is a partial plan view of another face of the elastic sheet not facing the wafer tray in the semiconductor integrated circuit testing system of the embodiment.

FIG. 4 shows the plane structure of the lower face of the elastic sheet 103 facing the wafer tray 111, and FIG. 5 shows the plane structure of the upper face of the elastic sheet 103 not facing the wafer tray 111.

As shown in FIGS. 4 and 5, the dummy bumps 106 are provided in a region on the elastic sheet 103 where the bumps 104 are distributed at a relatively low density, namely, in a region on the elastic sheet 103 outside a region where the bumps 104 are provided. Specifically, the dummy bumps 106 are provided in circumferential positions on the elastic sheet 103 corresponding to the periphery of the semiconductor wafer 1 and arranged on lines extended from positions of the bumps 104.

In this embodiment, since the dummy bumps 106 are disposed in the region on the elastic sheet 103 where the bumps 104 are distributed relatively sparsely (namely, in the region outside the region where the bumps 104 are disposed), when the internal pressure of the sealed space 118 is reduced, the dummy bumps 106 resist the force to bring the interconnect substrate 101 close to the wafer tray 111. Therefore, the periphery of the interconnect substrate 101 can be prevented from deforming toward the wafer tray 111.

Accordingly, the bumps 104 positioned in the peripheral region on the elastic sheet 103 can be prevented from being strongly pressed against the corresponding external electrodes 2. As a result, the degradation of the durability of the peripheral bumps 104 because of large deformation of the tips of the bumps 104 can be avoided, and the contact resistance between the center bumps 104 and the corresponding external electrodes 2 can be lowered because the force to bring the bumps 104 into contact with the external electrodes 2 can be equalized in the plane of the semiconductor wafer 1.

In particular, since the dummy bumps 106 are provided in the circumferential portions on the elastic sheet 103 corresponding to the periphery of the semiconductor wafer 1, a distance between a circumferential portion of the elastic sheet 103 in contact with the ring-shaped sealing member 112 (corresponding to a portion shown with dashed lines in FIGS. 4 and 5) and the circumferential portions where the dummy bumps 106 are provided is constant. Therefore, the deformation of the periphery of the interconnect substrate 101 toward the wafer tray 111 can be definitely prevented.

Also, the dummy bumps 106 that are arranged on the straight lines extended from the positions of the bumps 104 are advantageous in the design and process.

Figure 2:
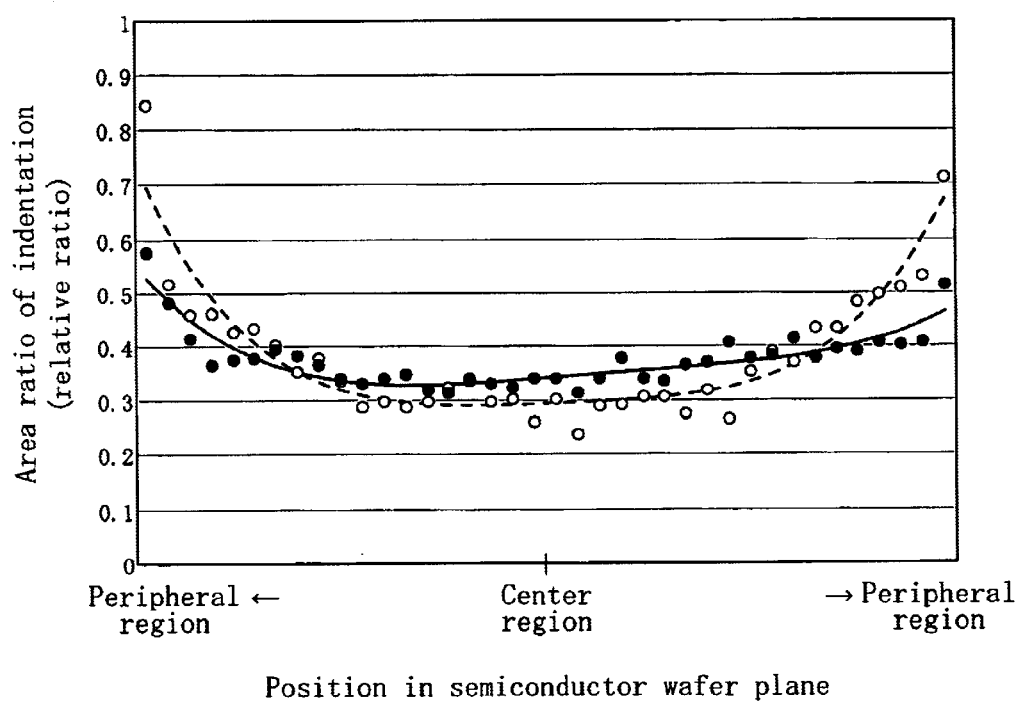
FIG. 2 is a diagram for showing the relationship, in the semiconductor integrated circuit testing system of the embodiment, the position of a bump in the plane of a semiconductor wafer (indicated by the abscissa) and the area ratio (relative ratio) of an indentation formed on the tip of the bump (indicated by the ordinate)
Figure 8:
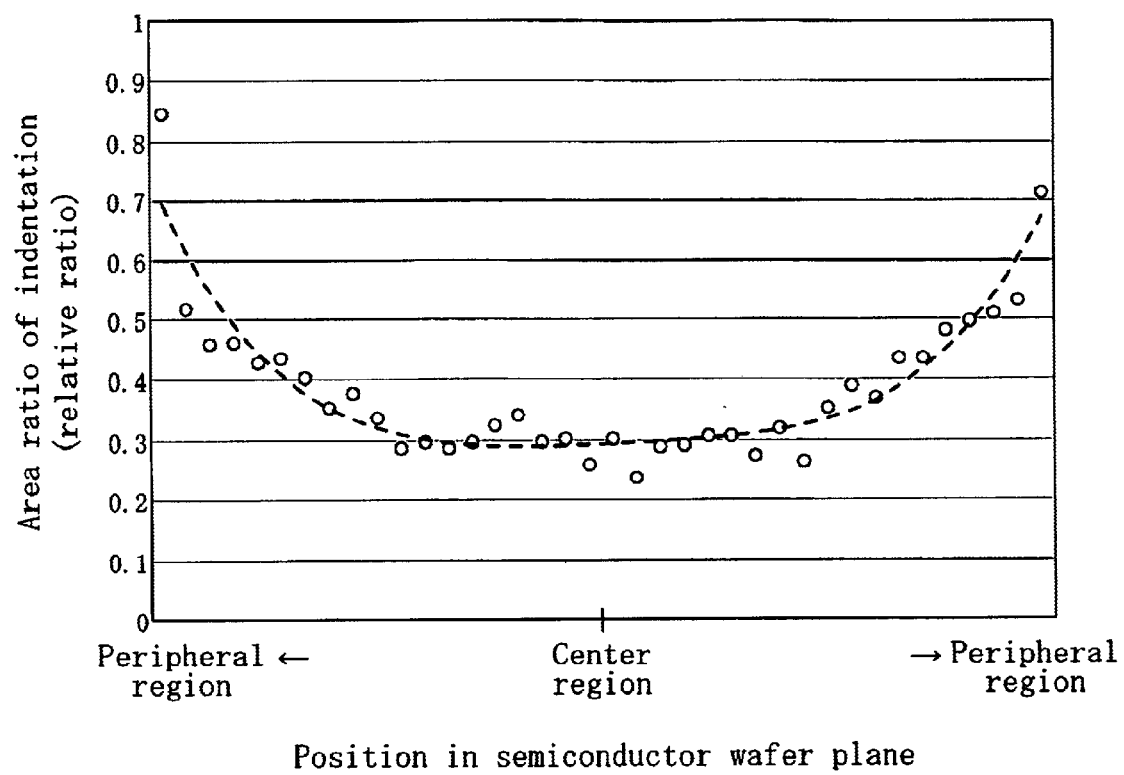
FIG. 8 is a diagram for showing the relationship, in the conventional semiconductor integrated circuit testing system, between the position of a bump in the plane of a semiconductor wafer (indicated by the abscissa) and the area ratio (relative ratio) of an indentation formed on the tip of the bump (indicated by the ordinate)
Figure 9A:
FIGS. 9A, 9B and 9C are diagrams of indentations formed on bumps in the conventional semiconductor integrated circuit testing system, and specifically.
Figure 9B:
Figure 9C:

FIG. 2 shows the relationship between the position of a bump in the plane of the semiconductor wafer (indicated by the abscissa) and the area ratio (relative ratio) of an indentation formed on the tip of the bump (indicated by the ordinate). In FIG. 2, a solid line denotes the relationship obtained in the embodiment of the invention and a broken line denotes the relationship obtained in the conventional system. Similarly to the conventional relationship shown in FIG. 8, the graph of FIG. 2 is obtained by plotting the area ratios of the indentations formed on the bumps 104 when the internal pressure of the sealed space 118 formed with the wafer tray 111, the ring-shaped sealing member 112 and the interconnect substrate 101 is reduced to a predetermined pressure and then restored to the atmospheric pressure.

As is understood from FIG. 2, the area ratio of the indentation formed on a peripheral bump is reduced as compared with that in the conventional system, and the area ratio of the indentation formed on a center bump is increased as compared with that in the conventional system. In other words, according to this embodiment, a difference in the area ratio of the indentation between the peripheral bump and the center bump is reduced.

When the dummy bumps 106 are disposed closer to the periphery or arranged more densely than in the layout shown in FIGS. 4 and 5, the difference in the area ratio of the indentation between the peripheral bump and the center bump can be further reduced.

Figure 3A:
FIGS. 3A, 3B and 3C are diagrams of indentations formed on bumps in the semiconductor integrated circuit testing system of the embodiment, and specifically.
Figure 3B:
Figure 3C:

FIGS. 3A through 3C show indentations formed on bumps in the testing system of this embodiment, and specifically, FIG. 3A shows the indentation formed on a center bump, and FIGS. 3B and 3C show the indentations formed on opposing outermost bumps. As is understood from comparison between FIGS. 3A through 3C and 9A through 9C, the proportion of the area of the indentation formed on the outermost bump to the area of the indentation formed on the center bump can be reduced by using the testing system of this embodiment.

Figure 6:
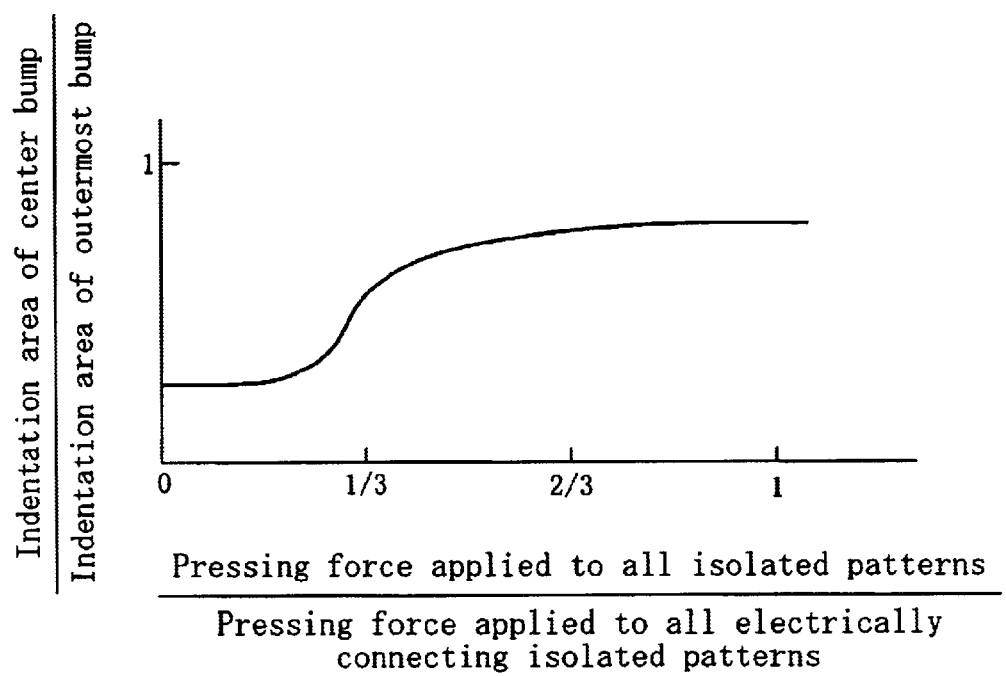
FIG. 6 is a graph for showing the relationship between (a pressing force applied to all dummy isolated patterns)/(a pressing force applied to all electrically connecting isolated patterns) and (an area of an indentation of a center bump)/(an area of an indentation of an outermost bump) in the semiconductor integrated circuit testing system of the embodiment.
Figure 7:
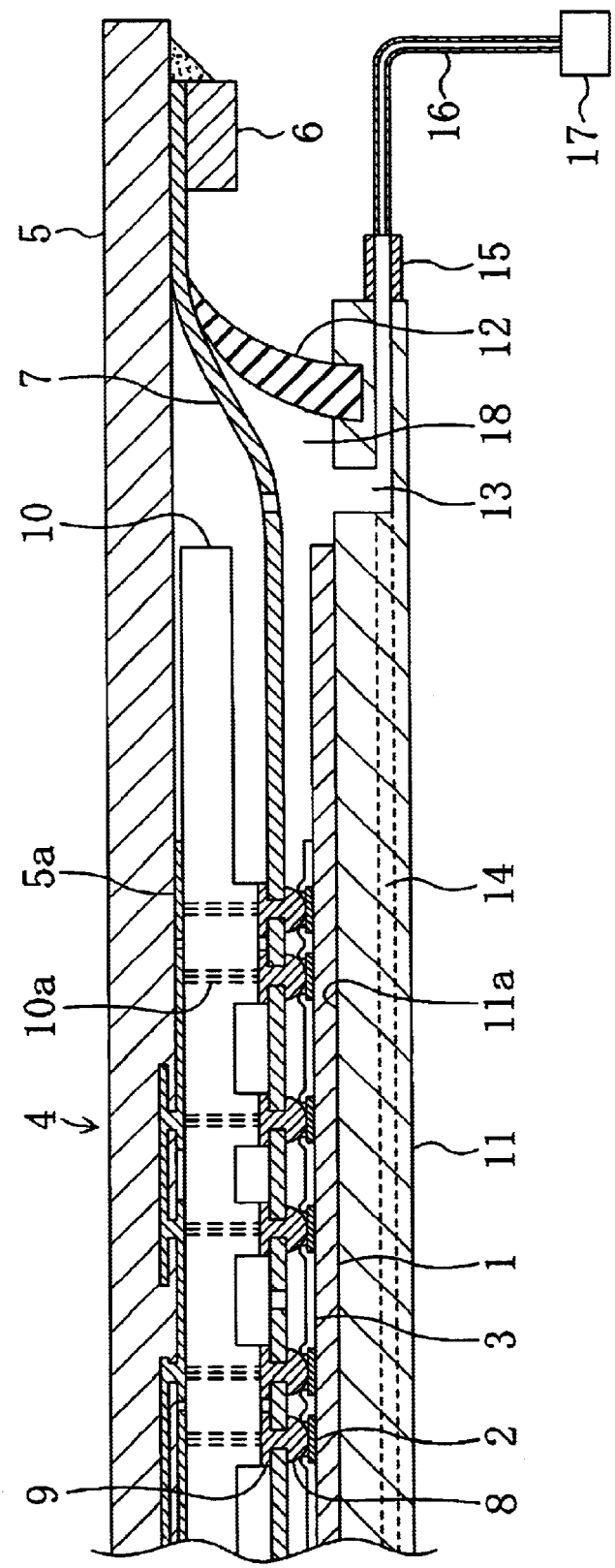
FIG. 7 is a partial cross-sectional view of a conventional semiconductor integrated circuit testing system.

FIG. 6 is a graph in which the abscissa indicates (a pressing force applied to all the dummy isolated patterns 107)/(a pressing force applied to all the electrically connecting isolated patterns 105) and the ordinate indicates (the area of an indentation formed on a center bump)/(the area of an indentation formed on an outermost bump).

The pressing force applied to all the dummy isolated patterns 107 or the pressing force applied to all the electrically connecting isolated patterns 105 means a pressure applied to the dummy isolated patterns 107 or the electrically connecting isolated patterns 105 when the internal pressure of the sealed space 118 is reduced to the predetermined pressure.

Also, the value X of (the pressing force applied to all the dummy isolated patterns 107)/(the pressing force applied to all the electrically connecting isolated patterns 105) can be obtained according to the following relational expression:

$$X=(S1/(S2-S3))\div(S3/S4)$$

wherein S1 indicates the total area of the dummy isolated patterns 107, S2 indicates the total area of a region on the testing substrate 101 where the pressure reducing force is applied, S3 indicates the effective area of the semiconductor integrated circuit devices (semiconductor chips) formed on the semiconductor wafer 1, and S4 indicates the total area of the electrically connecting isolated patterns 105.

As is understood from FIG. 6, in the case where the pressing force applied to all the dummy isolated patterns 107 when the internal pressure of the sealed space 118 is reduced is approximately ⅓ or more of the pressing force applied to all the electrically connecting isolated patterns 105 when the internal pressure of the sealed space 118 is reduced, the proportion in the area of the indentation between the center bump 104 and the outermost bump 104 can be remarkably close to 1, namely, a difference between the pressing force applied to the center bump 104 and the pressing force applied to the outermost bump 104 can be remarkably reduced.

Although the dummy bumps 106 are disposed in the region on the elastic sheet 103 outside the region where the bumps 104 are disposed in this embodiment, the dummy bumps 106 may be disposed instead in a portion of the center region on the elastic sheet 103 where the bumps 104 are distributed relatively sparsely. Also in this manner, the deformation of the interconnect substrate 101 can be prevented.

Also, although the protrusions are the independent semispherical dummy patterns in this embodiment, the shape of the protrusion is not herein specified but the protrusions can be in the shape of a band including a plurality of continuous dummy patterns.

Now, a method for testing electric characteristics of a plurality of semiconductor integrated circuit devices formed on the semiconductor wafer 1 by using the semiconductor integrated circuit testing system having the aforementioned structure will be described.

First, the wafer tray 111 is brought close to the testing substrate 100 with the external electrodes 2 of the semiconductor wafer 1 facing the bumps 104 of the testing substrate 100, so that the wafer tray 111, the ring-shaped sealing member 112 and the testing substrate 100 can together form the sealed space 118.

Next, the internal pressure of the pressure reducing groove 113 is reduced by driving the vacuum pump 117. In this manner, the pressure within the sealed space 118 is reduced, and hence, the cross-sectional shape of the ring-shaped sealing member 112 is elastically deformed to an arch shape. As a result, the testing substrate 100 and the wafer tray 111 are brought further closer to each other, so that the bumps 104 can be definitely brought into contact with the corresponding external electrodes 2.

At this point, a plurality of dummy bumps (protrusions) 106 protruding toward the wafer tray 111 and provided in the peripheral region on the face (lower face) of the elastic sheet 103 facing the wafer tray 111 prevent the deformation of the interconnect substrate 101 toward the wafer tray 111 while reducing the internal pressure of the sealed space 118 formed by the wafer tray 111, the ring-shaped sealing member 112 and the interconnect substrate 101.

Under this condition, a testing voltage is applied from a burn-in system not shown to some of the external electrodes 2 through the interconnect layers 101a of the interconnect substrate 101, the conducting particles 110a of the anisotropic conducting rubber sheet 110, the isolated patterns 105 and the bumps 104, and output signals output from other of the external electrodes 2 are input to the burn-in system. Thus, the burn-in system can evaluate the electric characteristics of the semiconductor integrated circuit devices.

What is claimed is:

1. A semiconductor integrated circuit testing system for testing electric characteristics of a plurality of semiconductor integrated circuit devices formed on a semiconductor wafer in the lump, comprising:

a wafer tray for holding said semiconductor wafer;

an interconnect substrate facing said semiconductor wafer held by said wafer tray and having interconnect layers to which a testing voltage is externally input;

a ring-shaped sealing member provided between said wafer tray and said interconnect substrate for forming a sealed space together with said wafer tray and said interconnect substrate;

an elastic sheet held on said interconnect substrate at a periphery thereof;

a plurality of probe terminals provided on said elastic sheet in positions respectively corresponding to external electrodes of said plurality of semiconductor integrated circuit devices and electrically connected to said interconnect layers; and a plurality of protrusions protruding toward said wafer tray and provided on said elastic sheet for preventing said interconnect substrate from deforming toward said wafer tray when an internal pressure of said sealed space is reduced, wherein said external electrodes and said interconnect layers are not electrically connected to each other via each of said plurality of protrusions.

2. The semiconductor integrated circuit testing system of claim 1,
wherein said plurality of protrusions are disposed in a region on said elastic sheet where said plurality of probe terminals are distributed relatively sparsely.

3. The semiconductor integrated circuit testing system of claim 1,
wherein said plurality of protrusions are disposed in a region on said elastic sheet outside a region where said plurality of probe terminals are provided.

4. The semiconductor integrated circuit testing system of claim 1,
wherein said plurality of protrusions are arranged circumferentially in a region on said elastic sheet corresponding to a periphery of said semiconductor wafer.

5. The semiconductor integrated circuit testing system of claim 1,
wherein said plurality of probe terminals are composed of electrically connecting isolated patterns provided on a first face of said elastic sheet facing said interconnect substrate and electrically connected to said interconnect layers, and bumps respectively integrated with said electrically connecting isolated patterns and provided on a second face of said elastic sheet facing said wafer tray, and said plurality of protrusions are composed of dummy isolated patterns provided on the first face of said elastic sheet, and dummy bumps respectively integrated with said dummy isolated patterns and provided on the second face of said elastic sheet.

6. The semiconductor integrated circuit testing system of claim 5, wherein a pressing force, which is the difference between the atmospheric pressure and the pressure of said sealed space after pressure reduction, applied to all of said dummy isolated patterns when the internal pressure of said sealed space is reduced is approximately ⅓ or more of said pressing force applied to all of said electrically connecting isolated patterns when the internal pressure of said sealed space is reduced.

7. A semiconductor integrated circuit testing method using a testing system including a wafer tray for holding a semiconductor wafer on which a plurality of semiconductor integrated circuit devices respectively having external electrodes are formed; an interconnect substrate having interconnect layers to which a testing voltage is externally input; a ring-shaped sealing member provided between said wafer tray and said interconnect substrate for forming a sealed space together with said wafer tray and said interconnect substrate; an elastic sheet held on said interconnect substrate at a periphery thereof; a plurality of probe terminals provided on said elastic sheet in positions respectively corresponding to said external electrodes of said plurality of semiconductor integrated circuit devices and electrically connected to said interconnect layers; and a plurality of protrusions protruding toward said wafer tray and provided on said elastic sheet, said external electrodes and said interconnect layers are not electrically connected to each other via each of said plurality of protrusions, the method comprising the steps of:

holding said semiconductor wafer on said wafer tray with said external electrodes of said plurality of semiconductor integrated circuit devices respectively facing said plurality of probe terminals provided on said elastic sheet;

forming said sealed space with said wafer tray, said ring-shaped sealing member and said interconnect substrate by making said wafer tray holding said semiconductor wafer and said interconnect substrate come close to each other;

reducing an internal pressure of said sealed space for bringing said plurality of probe terminals into contact with said external electrodes respectively facing said plurality of probe terminals; and testing electric characteristics of said plurality of semiconductor integrated circuit devices in the lump by applying the testing voltage to said external electrodes in contact with said plurality of probe terminals through said interconnect layers and said plurality of probe terminals, wherein the step of reducing the internal pressure of said sealed space includes a sub-step of preventing said interconnect substrate from deforming toward said wafer tray by bringing said plurality of protrusions into contact with said semiconductor wafer held on said wafer tray.

8. The semiconductor integrated circuit testing method of claim 7, wherein said plurality of protrusions are disposed in a region on said elastic sheet where said plurality of probe terminals are distributed relatively sparsely.

9. The semiconductor integrated circuit testing method of claim 7, wherein said plurality of protrusions are disposed in a region on said elastic sheet outside a region where said plurality of probe terminals are provided.

10. The semiconductor integrated circuit testing method of claim 7, wherein said plurality of protrusions are arranged circumferentially in a region on said elastic sheet corresponding to a periphery of said semiconductor wafer.

11. The semiconductor integrated circuit testing method of claim 7, wherein said plurality of probe terminals are composed of electrically connecting isolated patterns provided on a first face of said elastic sheet facing said interconnect substrate and electrically connected to said interconnect layers, and bumps respectively integrated with said electrically connecting isolated patterns and provided on a second face of said elastic sheet facing said wafer tray, and said plurality of protrusions are composed of dummy isolated patterns provided on the first face of said elastic sheet, and dummy bumps respectively integrated with said dummy isolated patterns and provided on the second face of said elastic sheet.

12. The semiconductor integrated circuit testing method of claim 11, wherein a pressing force, which is the difference between the atmospheric pressure and the pressure of said sealed space after pressure reduction, applied to all of said dummy isolated patterns when the internal pressure of said sealed space is reduced is approximately ⅓ or more of said pressing force applied to all of said electrically connecting isolated patterns when the internal pressure of said sealed space is reduced.

13. A semiconductor integrated circuit testing system for testing electric characteristics of a plurality of semiconductor integrated circuit devices formed on a semiconductor wafer in the lump, comprising:

a wafer tray for holding said semiconductor wafer;

an interconnect substrate facing said semiconductor wafer held by said wafer tray and having interconnect layers to which a testing voltage is externally input;

a ring-shaped sealing member provided between said wafer tray and said interconnect substrate for forming a sealed space together with said wafer tray and said interconnect substrate;

an elastic sheet held on said interconnect substrate at a periphery thereof;

a plurality of probe terminals provided on said elastic sheet in positions respectively corresponding to external electrodes of said plurality of semiconductor integrated circuit devices and electrically connected to said interconnect layers;

a plurality of protrusions protruding toward said wafer tray and provided on said elastic sheet, such that said external electrodes and said interconnect layers are not electrically connected to each other via each of said plurality of protrusions, and said plurality of protrusions is in contact with said interconnect layers when an internal pressure of said sealed space is reduced.

14. A semiconductor integrated circuit testing method using a testing system including a wafer tray for holding a semiconductor wafer on which a plurality of semiconductor integrated circuit devices respectively having external electrodes are formed; an interconnect substrate having interconnect layers to which a testing voltage is externally input; a ring-shaped sealing member provided between said wafer tray and said interconnect substrate for forming a sealed space together with said wafer tray and said interconnect substrate; an elastic sheet held on said interconnect substrate at a periphery thereof; a plurality of probe terminals provided on said elastic sheet in positions respectively corresponding to said external electrodes of said plurality of semiconductor integrated circuit devices and electrically connected to said interconnect layers; and a plurality of protrusions protruding toward said wafer tray and provided on said elastic sheet, said external electrodes and said interconnect layers are not electrically connected to each other via each of said plurality of protrusions, the method comprising the steps of:

holding said semiconductor wafer on said wafer tray with said external electrodes of said plurality of semiconductor integrated circuit devices respectively facing said plurality of probe terminals provided on said elastic sheet;

forming said sealed space with said wafer tray, said ring-shaped sealing member and said interconnect substrate by making said wafer tray holding said semiconductor wafer and said interconnect substrate come close to each other;

reducing an internal pressure of said sealed space for bringing said plurality of probe terminals into contact with said external electrodes respectively facing said plurality of probe terminals; and testing electric characteristics of said plurality of semiconductor integrated circuit devices in the lump by applying the testing voltage to said external electrodes in contact with said plurality of probe terminals through said interconnect layers and said plurality of probe terminals, wherein the step of reducing the internal pressure of said sealed space includes a sub-step of bringing said plurality of protrusions into contact with said semiconductor wafer held on said wafer tray.

* * * * *